United States Patent
Kaushal et al.

(10) Patent No.: US 7,670,688 B2
(45) Date of Patent: Mar. 2, 2010

(54) EROSION-RESISTANT COMPONENTS FOR PLASMA PROCESS CHAMBERS

(75) Inventors: Tony S. Kaushal, Cupertino, CA (US);
You Wang, Cupertino, CA (US);
Ananda H. Kumar, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 2467 days.

(21) Appl. No.: 09/892,212

(22) Filed: Jun. 25, 2001

(65) Prior Publication Data

US 2004/0033385 A1    Feb. 19, 2004

(51) Int. Cl.
*B32B 15/04* (2006.01)
*B32B 9/00* (2006.01)
*C23C 16/00* (2006.01)

(52) U.S. Cl. .................. 428/469; 428/472; 428/698; 428/701; 428/702; 118/723 R

(58) Field of Classification Search ............... 428/697, 428/472, 698, 701, 702, 699, 469; 427/237, 427/596, 255.31, 255.32, 453; 118/723 R, 118/723 I
See application file for complete search history.

(56) References Cited

U.S. PATENT DOCUMENTS

| | | |
|---|---|---|
| 4,714,624 A | 12/1987 | Naik |
| 5,035,923 A * | 7/1991 | Sarin ..................... 427/255.15 |
| 5,236,151 A | 8/1993 | Hagle et al. |
| 5,306,895 A | 4/1994 | Ushikoshi et al. |
| 5,680,013 A | 10/1997 | Dornfest et al. |
| 5,911,852 A | 6/1999 | Katayama et al. |
| 5,959,409 A | 9/1999 | Dornfest et al. |
| 6,074,488 A | 6/2000 | Roderick et al. |
| 6,095,084 A | 8/2000 | Shamouilian et al. |
| 6,101,969 A | 8/2000 | Niori et al. |
| 6,120,640 A | 9/2000 | Shih et al. |
| 6,123,791 A | 9/2000 | Han et al. |
| 6,139,983 A | 10/2000 | Ohashi et al. |
| 6,251,473 B1 * | 6/2001 | Wang et al. ............. 427/126.3 |
| 6,310,755 B1 * | 10/2001 | Kholodenko et al. ........ 361/234 |
| 6,352,611 B1 | 3/2002 | Han et al. |
| 6,613,442 B2 * | 9/2003 | O'Donnell et al. .......... 428/469 |
| 6,805,952 B2 * | 10/2004 | Chang et al. ................ 428/334 |
| 2001/0003271 A1 * | 6/2001 | Otsuki ..................... 118/723 I |

FOREIGN PATENT DOCUMENTS

| | | | |
|---|---|---|---|
| JP | 05238855 | * | 9/1993 |
| JP | 2000-12520 | | 1/2000 |

* cited by examiner

*Primary Examiner*—Timothy M Speer
(74) *Attorney, Agent, or Firm*—Mayer & Williams PC; David B. Bonham, Esq.; Keum J. Park, Esq.

(57) ABSTRACT

An erosion-resistant article for use as a component in plasma process chamber. The erosion-resistant article comprises a support and an oxide coating comprising yttrium, which is disposed over the support. The support and the oxide coating preferably have material compositions that differ from one another in coefficient of thermal expansion by no more than $5 \times 10^{-6}$/K. Preferred oxide coating compositions include yttria and yttrium aluminum garnet. Preferred supports include alumina supports and aluminum-silicon carbide supports.

32 Claims, 5 Drawing Sheets

EROSION-RESISTANT COMPONENTS FOR PLASMA PROCESS CHAMBERS

BACKGROUND OF THE INVENTION

1. Field of the Invention

The present invention relates to components for use in plasma process chambers, and more particularly to components for use in plasma process chambers that have superior erosion resistance.

2. Brief Description of the Background Art

The semiconductor industry relies on high throughput, single substrate processing reactors, which can be used for a variety of different plasma processes including plasma-enhanced CVD (PECVD) and plasma-assisted etching.

In some process chamber environments, for example, halogen containing high-density plasma-etching chamber environments, conditions are highly aggressive, causing erosion of various chamber components, including chamber walls, liners, process kits and dielectric windows. This is particularly true of high-density fluorine-containing plasma-etching environments, which are frequently used in connection with dielectric etching processes.

Some process chamber components (for example, chamber walls and liners for inductively coupled plasma reactors) are made from electrically conductive materials. Such conductive components are commonly made from aluminum and anodized aluminum. Unfortunately, in aggressive process chamber environments like those described above, significant aluminum erosion occurs. This erosion results in the formation of aluminum particles and contaminant compounds that can cause damage to the substrate being processed. It is known in the art to address this problem by coating these materials with a layer of yttria (i.e., yttrium oxide, which is typically represented by the formula $Y_2O_3$) or with a coating of YAG (i.e., yttrium aluminum garnet, which is a solid solution of aluminum oxide and yttrium oxide and is typically represented by the formula $Y_3Al_5O_{12}$). However, these coatings, while being resistant to plasma erosion, frequently suffer from spalling and cracking.

Other process chamber components are required to be electrically insulating in nature. For example, in inductively coupled plasma process chambers, a plasma is generated in a reactive gas inside the chamber using an inductive coil that is placed outside the chamber. For effective coupling of power from the inductive coil to the gas inside, it is necessary to fabricate the chamber component that is positioned between the inductive coil and the chamber interior (for example, the chamber roof) from an electrical insulator such as a ceramic or quartz. The material most commonly used to fabricate such "dielectric windows" is aluminum oxide (alumina). However, in aggressive chamber environments like those previously described, etching of the alumina can occur, leading to the formation of particles and contaminating compounds. Chamber roofs made of yttrium-aluminum oxide (e.g., yttrium aluminum garnet) are known and hold up much better than alumina in terms of erosion. However, yttrium aluminum garnet is relatively more expensive than alumina, and it is also typically more brittle.

SUMMARY OF THE INVENTION

The above and other disadvantages of the prior art are overcome by the present invention, in which etch-resistant plasma process chamber components are provided. According to an embodiment of the invention, an erosion-resistant plasma process chamber component is provided which comprises (a) a support and (b) an oxide coating comprising yttrium disposed over the support. The support and the oxide coating have material compositions that are matched to one another in coefficient of thermal expansion (CTE). Preferably, the support and the oxide coating have material compositions that differ from one another in CTE by no more than $5\times10^{-6}$/K. More preferably, the material compositions differ from one another in coefficient of thermal expansion by no more than $3\times10^{-6}$/K, and most preferably by no more than $1\times10^{-6}$/K.

Preferred supports for the practice of the present invention include aluminum-silicon carbide, aluminum oxide, aluminum nitride, silicon carbide, and zirconium alloy supports. Preferred coatings are yttrium oxide coatings and oxides comprising yttrium and aluminum (e.g., yttrium aluminum garnet).

Specific process chamber components appropriate for the practice of the invention include chamber wall components, dielectric windows and ring-shaped components, including focus rings, capture rings, and insert rings.

In some embodiments of the invention, the erosion-resistant article further comprises an intermediate region between the oxide coating and the support, wherein the intermediate region, the support and the oxide coating have material compositions that differ from one another in coefficient of thermal expansion by no more than $5\times10^{-6}$/K.

According to another embodiment of the invention, a method of making an erosion-resistant plasma process chamber component is provided which comprises the following: (a) providing a support; and (b) providing an oxide coating comprising yttrium disposed over the support. The support and the oxide coating have material compositions that differ from one another in coefficient of thermal expansion by no more than $5\times10^{-6}$/K.

In some preferred methods, the oxide coating is provided over the support by a process comprising a physical vapor deposition step, a chemical vapor deposition step, or a thermal spraying step (e.g., a plasma-spraying step).

In other preferred methods, the oxide coating is provided by a process comprising a sintering step. For example, the oxide coating can be provided by a process comprising a hot pressing step or a process comprising a dry pressing step and a sintering step.

In other preferred methods, both the support and the oxide coating are provided by a process comprising at least one sintering step. For example, the support can be formed from a powdered raw mixture comprising alumina particles and the oxide coating can be formed from a powdered raw mixture comprising (a) particles of yttrium oxide, (b) particles of yttrium aluminum garnet, or (c) particles of both yttrium oxide and aluminum oxide.

One advantage of the present invention is that process chamber components are provided, which are highly resistant to erosion in the presence of a high-density plasma of one or more halogen containing enchant gases, including fluorine containing enchant gases.

Another advantage of the present invention is that process chamber components are provided which are relatively resistant to large thermal gradients. For example, in the compositions of the present invention, differences between the CTE of the oxide coating and the CTE of the support material are kept small. As a result, spalling and cracking, which are observed with prior art conductive process chamber components such as YAG- or yttria-coated aluminum components, are substantially reduced.

Yet another advantage of the present invention is that process chamber components are provided which are durable.

For example, a durable material such as alumina or alumina-infiltrated silicon carbide can be used as a support material for the process chamber components of the present invention. As a result, product brittleness, which is observed with some prior art process chamber components, including dielectric windows constructed entirely of yttrium-aluminum oxide, is avoided.

The above and other embodiments and advantages of the present invention will become readily apparent to those of ordinary skill in the art upon review of the Detailed Description and Claims to follow.

DETAILED DESCRIPTION OF PREFERRED EMBODIMENTS OF THE INVENTION

The present invention now will be described more fully hereinafter with reference to the accompanying drawings, in which preferred embodiments of the present invention are shown. This invention may, however, be embodied in different forms and should not be construed as limited to the embodiments set forth herein.

Figure 1:
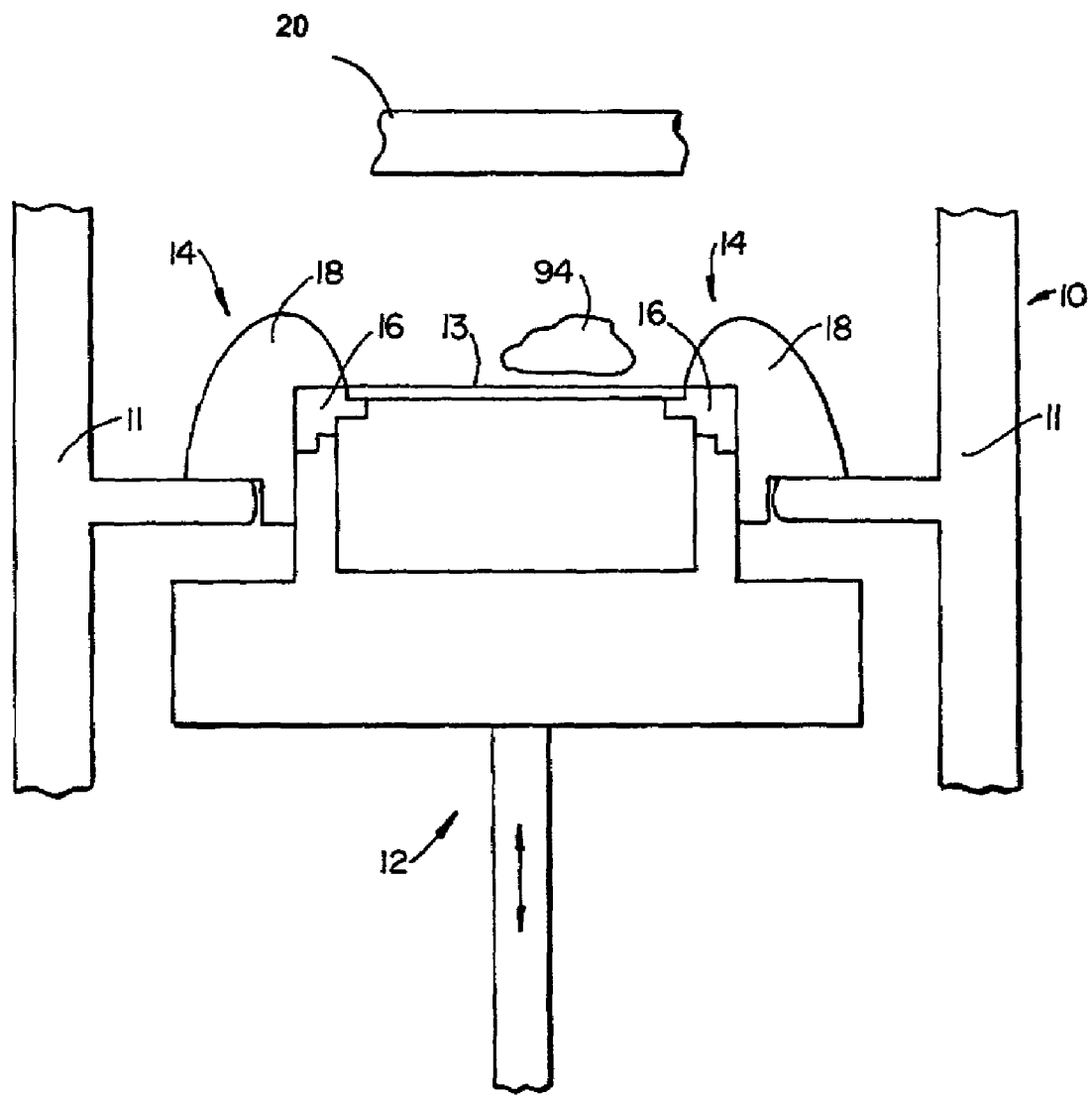
FIG. 1 is a schematic partial side elevation view of a plasma process chamber in accordance with an embodiment of the present invention.
Figure 2:
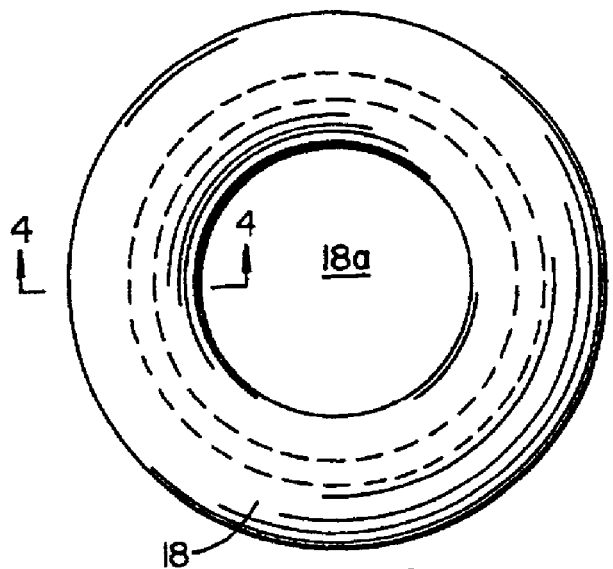
FIG. 2 is a top plan view of the focus ring of FIG. 1.
Figure 3:
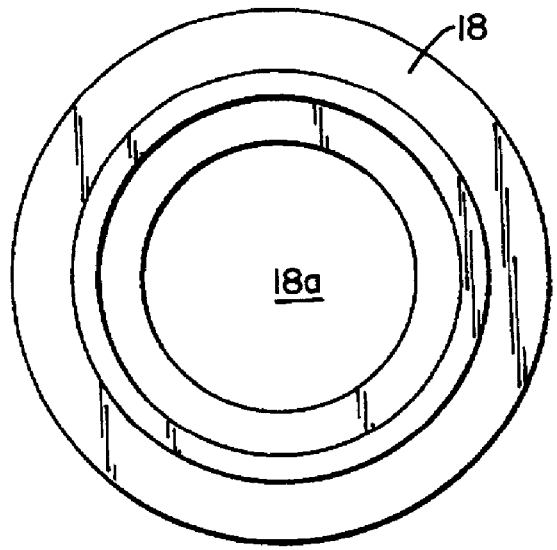
FIG. 3 is a bottom plan view of the focus ring in FIG. 1.
Figure 4:
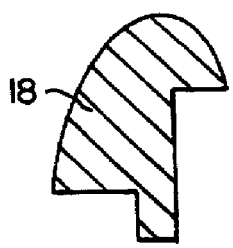
FIG. 4 is a vertical sectional view taken in direction of the arrows and along the plane of line 4-4 in FIG. 2.
Figure 5:
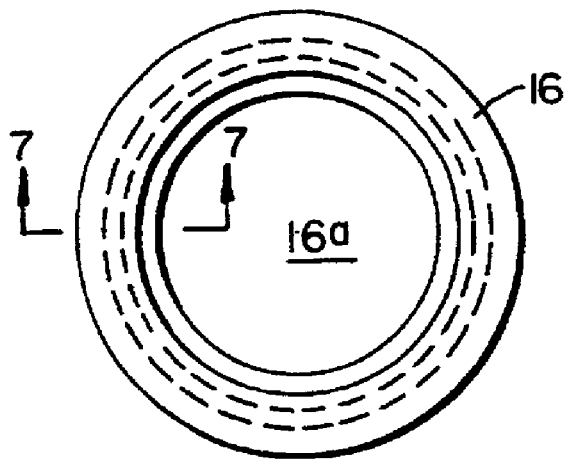
FIG. 5 is a top plan view of the substrate-capture ring of FIG. 1.
Figure 6:
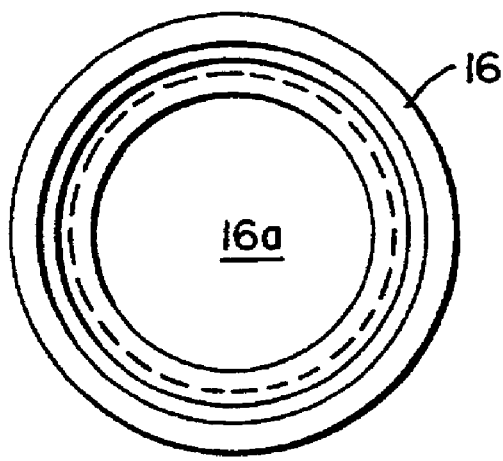
FIG. 6 is a bottom plan view of the substrate-capture ring in FIG. 1.
Figure 7:
FIG. 7 is a vertical sectional view taken in direction of the arrows and along the plane of line 7-7 in FIG. 5.

Referring now to FIG. 1, there is seen a plasma process chamber, schematically illustrated as 10, having a chamber wall 11, which can further be provided with a wall liner (not shown) if desired. As previously noted, chamber walls 11 and liners are frequently made of conductive materials, allowing them to be effectively electrically grounded.

Plasma process chamber 10 also includes a pedestal assembly, generally illustrated as 12, for supporting a substrate 13, such as a semiconductor wafer, while the substrate 13 is processed within the plasma process chamber 10.

Figure 8:
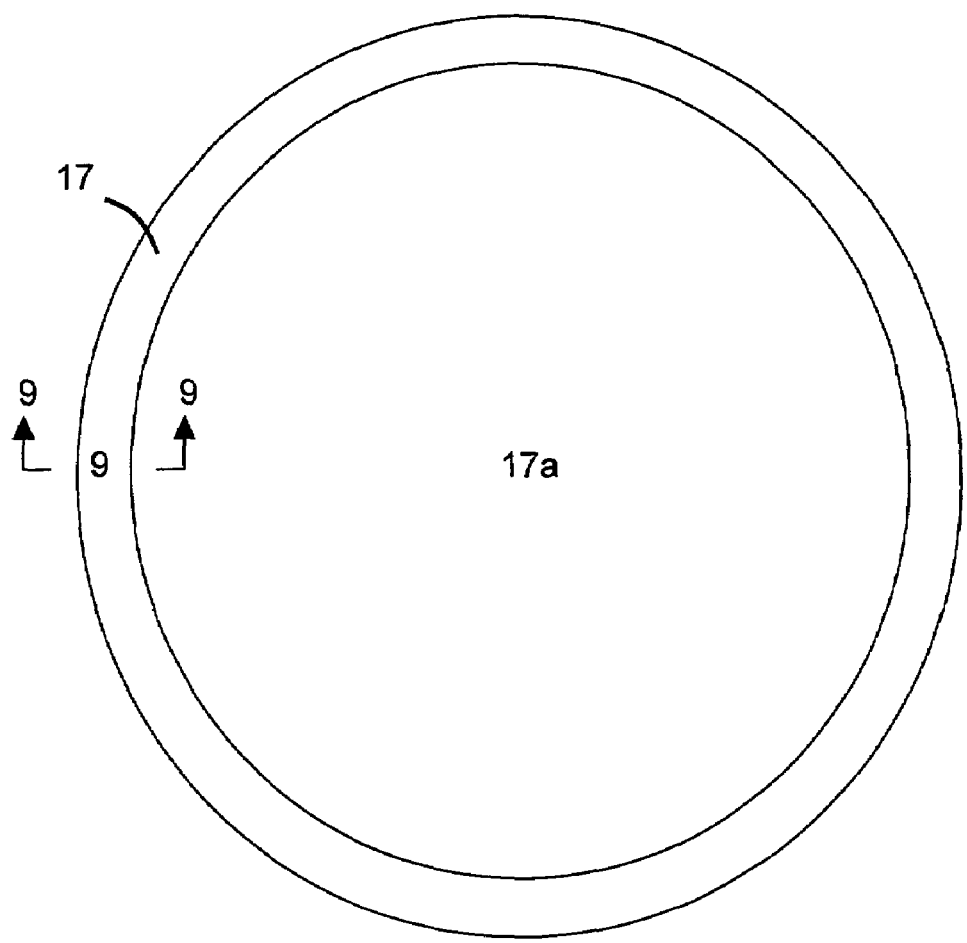
FIG. 8 is a top plan view of an insert ring in accordance with an embodiment of the present invention.
Figure 9:
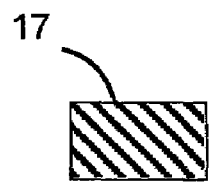
FIG. 9 is a vertical sectional view taken in direction of the arrows and along the plane of line 9-9 in FIG. 8.

A process kit, generally illustrated as 14, is also seen in FIG. 1. Process kits are frequently employed within processing chambers as an aid to substrate processing. Process kits typically include one or more rings, including insert rings, capture rings, and focus rings. These rings can typically be either conductive or insulating in nature, as desired, with conductive insert rings being preferable for insert rings under some circumstances. The process kit 14 shown includes a substrate-capture ring 16 connected to the pedestal assembly 12 for retaining the substrate 13 in a generally stationary position during processing. The process kit 14 also includes a focus ring 18 to assist in keeping high-density plasma 94 of a processing gas concentrated and/or positioned over the substrate 13. The substrate-capture ring 16 and the focus ring 18 have respective ring openings 16a and 18a (see the detailed views of focus ring 18 and capture ring 16 presented in FIGS. 2-7). Other rings, such as an insert ring 17, having ring opening 17a, can also be used in connection with the process kit 14 if desired (see, e.g. FIGS. 8 and 9).

The substrate 13 may be processed within the plasma process chamber 10 by a number of plasma processing procedures, including various plasma etching procedures. During plasma processing, power (e.g., RF power, magnetron power, microwave power, etc.) preferably passes through a dielectric window 20 that is composed of an insulating material and becomes coupled to the high-density plasma 94 of the processing gas.

When the substrate 13 is plasma processed, various process chamber components are subject to erosion. Erosion is particularly profound when the substrate 13 is processed by etching in a high density plasma of a halogen-containing etching gas, such as: (a) fluorine containing etching gasses (e.g., $CHF_3$, $CF_4$, $NF_3$), which are commonly used, for example, in semiconductor and dielectric etching processes, and (b) chlorine containing etching gasses (e.g., $Cl_2$, $BCl_3$ and HCl), which are commonly used, for example, in metal etching processes. Erosion is particularly severe with fluorine containing etching gases.

In accordance with an embodiment of the present invention, process chamber 10 components that are exposed to such erosive plasma environments, including chamber walls 11 and liners, dielectric windows 20 and process kit 14 components, are constructed from compositions that are extremely resistant to erosion.

A high-density plasma may be defined as a plasma of an etchant gas having an ion density greater than about $10^{11}/cm^3$. The source of the high-density plasma may be any suitable high-density source, such as electron cyclotron resonance (ECR), helicon resonance or ICP-type (inductively coupled plasma-type) sources.

Figure 10:
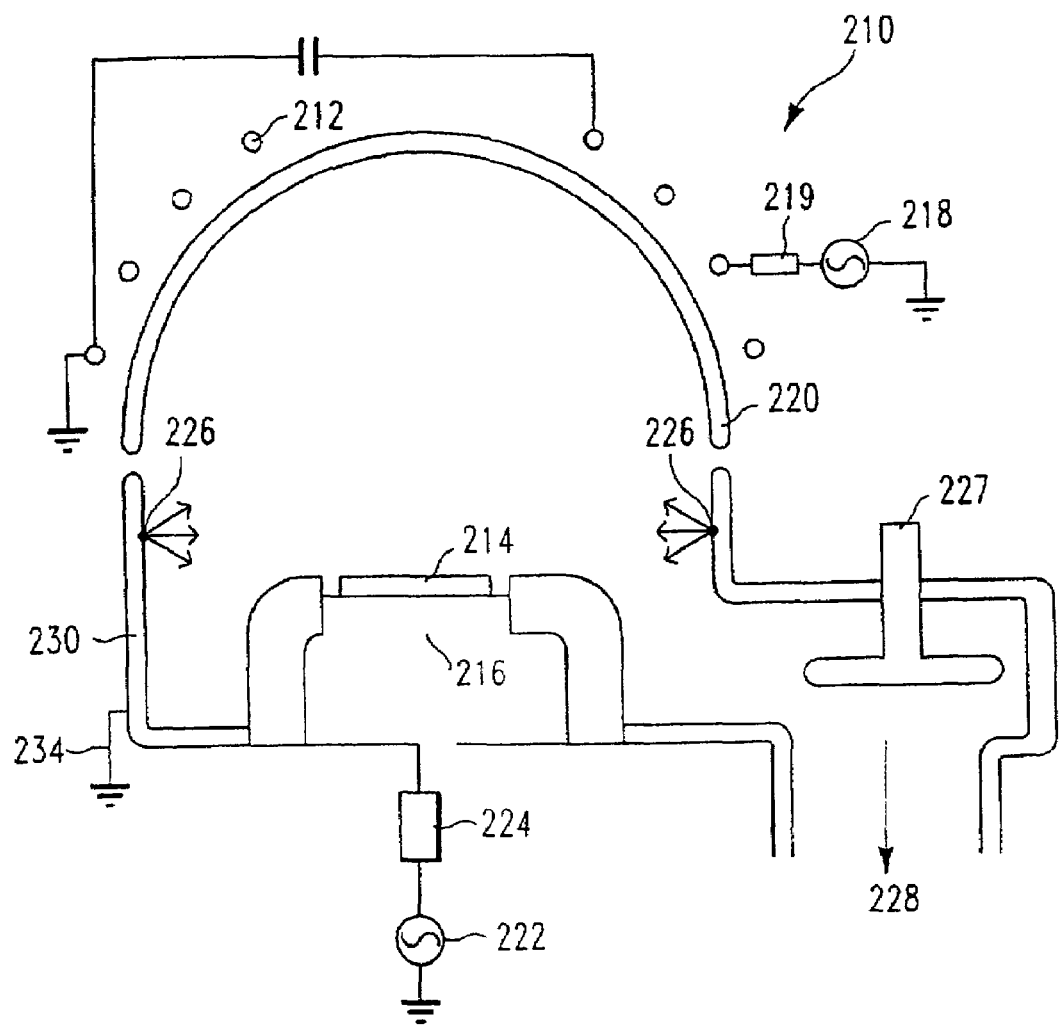
FIG. 10 is a schematic partial side elevation view of an inductively coupled RF plasma process chamber in accordance with an embodiment of the present invention.

One exemplary high-density-plasma system in which the process chamber components of the present invention can be utilized is a DPS (decoupled plasma source) etching system. However, it should be appreciated that other plasma-generating systems are also appropriate. A schematic diagram of one such DPS system, which is disclosed in U.S. Pat. No. 6,074,954, the entire disclosure of which is incorporated by reference, is found in FIG. 10.

This Figure illustrates a plasma process chamber 210, which is constructed to include at least one inductive coil antenna segment 212, positioned exterior to a dielectric, shaped ceiling 220, and connected to a radio frequency (RF) power generator 218 (which may be a source power generator with a frequency tunable around 12.56 MHz for impedance matching at different plasma conditions, or which may be a source power generator of fixed frequency which is connected through an impedance matching network 219). The geometry of the inductive coil antenna 212 can in large part determine the spatial distribution of the ion density of the plasma that is produced within the plasma process chamber 210.

Plasma process chamber 210 also includes a substrate 214 on a support pedestal (cathode) 216, which is connected to an RF frequency power generator 222 (which may be a bias power generator at a fixed frequency ranging between about 400 kHz and 13.56 MHz) through an impedance matching network 224. The power applied to the substrate pedestal 216 may also be DC. Separating the bias and source power supplies facilitates independent control of ion density and ion energy, in accordance with well-known techniques.

The plasma process chamber 210 also includes a conductive chamber wall 230, which serves as the electrical ground 234. The chamber wall 230 may further include a conductive liner (not shown). Moreover, a process kit (not shown) like that described above with FIGS. 1-9 may be used in connection with the plasma process chamber 210.

In operation, the semiconductor substrate 214 is placed on the support pedestal 216 and gaseous components are fed into the plasma process chamber through entry ports 226. A plasma is ignited in plasma process chamber 210 by applying RF powers via 218 and 222. Pressure within the etch plasma process chamber 210 is controlled using a vacuum pump (not shown) and a throttle valve 227 situated between plasma process chamber 210 and the vacuum pump by which gaseous species 228 are removed. The temperature on the surface of the etch chamber walls is controlled using liquid-containing conduits (not shown), which are located in the walls of the etch chamber 210. The temperature of the semiconductor substrate is controlled by stabilizing the temperature of the support pedestal and flowing helium gas in the channels formed by the back of the substrate and grooves (not shown) on the pedestal 216 surface. The helium gas is used to facilitate heat transfer between the substrate and the pedestal.

One plasma process chamber which would benefit from the etch resistant components of the present invention is a Silicon DPS Chamber available from Applied Materials, Inc. of Santa Clara, Calif. This plasma processing chamber enables the processing of up to 12-inch (300 mm) diameter silicon substrate surface.

The present invention is directed to plasma process chamber components (including chamber walls and liners, dielectric windows and process kit components, such as insert rings, focus rings and capture rings), which are constructed from compositions that are extremely resistant to erosion. The components of the present invention can be used in essentially any plasma processing apparatus, including those illustrated in the Figures, and comprise an yttrium containing oxide coating disposed over a support material of a differing composition.

By "yttrium containing oxide coating" or "oxide coating comprising yttrium" is meant an oxide region that: (1) contains yttrium (other than as an impurity) and (2) is disposed upon a support material, covering at least a portion of the same. Yttrium containing oxide coatings for use in connection with the present invention are preferably selected from yttrium oxide and combinations of yttrium oxide and aluminum oxide (e.g., yttrium aluminum garnet).

The support material, which typically constitutes the bulk of the plasma-process-chamber component, is typically selected based on the overall properties desired for the plasma process chamber component, including electrical conductivity, dielectric constant, and/or mechanical properties such as tensile strength and elastic modulus. The support material is also preferably formed of a material that has a CTE that differs from the CTE of the oxide coating by $5 \times 10^{-6}$/K or less, more preferably $3 \times 10^{-6}$/K or less, even more preferably $2 \times 10^{-6}$/K or less, and most preferably $1 \times 10^{-6}$/K or less. Preferred support materials include aluminum oxide, aluminum nitride, zirconium containing alloys such as Zr-702 alloy, silicon carbide, and aluminum-silicon carbide.

By providing a relatively close match in CTE between the support material and the coating, thermal stresses within the final component are minimized. In this way, the present invention provides plasma process chamber components that distinctly differ from prior art components, such as those composed of YAG-coated or yttrium-oxide-coated aluminum, in which large differences in CTE between the coating and the support cause the coating to crack and delaminate.

In some embodiments, the composition of the yttrium containing oxide coating is constant throughout. In other embodiments, the composition of the oxide coating will vary. For example, it may be desirable to vary the composition of the oxide coating in a continuous or stepwise fashion.

It may also be desirable in some embodiments to insert an intermediate region that is free of yttrium (other than in impurity amounts) between the support material and the yttrium containing oxide coating. The intermediate region can serve, for example, to increase adhesion between the support material and oxide coating and/or to provide a region having a CTE that is intermediate that of the support material and the oxide coating. This intermediate region can be of a single composition or can vary in composition in a continuous or stepwise fashion. As an example, an intermediate coating of $Al_2O_3$ or $Zr_2O_3$ can be provided between an yttrium oxide coating and a zirconium alloy support such as Zr-702. As another example, an intermediate coating of $Zr_2O_3$ can be provided between an yttrium oxide coating and an $Al_2O_3$ support.

Sintering techniques are a preferred group of methods for forming the plasma process chamber components of the present invention. Among other advantages, sintering allows bodies of relatively complex shape to be formed, including most plasma process chamber components.

Sintering consolidates a powdered raw mixture of desired composition into a gross body. The composition of the powdered raw mixture determines the composition of the sintered body. In addition to the materials that are desired in the final composition, powdered raw mixtures can further include other constituents, including polymer binders (such as Gum Arabica) and sintering aids (such as calcium oxide, magnesium oxide, silica, and silica glasses containing calcium and magnesium oxides), as is well known in the art.

Once produced, the powdered raw mixture is manipulated into a desired shape. Shaping may be accomplished by any suitable process, which transforms the powdered raw mixture into a shape of desired particle packing and homogeneity. In one preferred embodiment of the invention, the powdered raw mixture is shaped by dry pressing, which is sometimes referred to as dust-pressing, die-pressing or uni-axial compaction. In dry pressing, the powdered raw mixture is placed inside a die cavity whereupon pressure is applied in a uni-axial direction to provide a porous body of desired shape. In the present invention, the desired shape is preferably the shape of a plasma process chamber component, such as a chamber wall, lining, dielectric window or process kit component (e.g., a substrate-capture ring, focus ring or insert ring). Dry pressing is well known to those of ordinary skill in the art.

After the powdered raw mixture is compressed within the die cavity, the resulting body is ejected and sintered. Sintering provides inter-particle bonding that generates the attractive forces needed to hold together the otherwise loose-formed powdered raw mixture. Sintering is the result of atomic motion stimulated by high temperatures, which causes the particles of the formed powdered raw mixture to bond together when they are heated to such high temperatures. Sintering of the compacted powdered raw mixture of the present invention may be performed with any suitable furnace (e.g. combustion or electric) at any suitable temperature, pressure, heating and cooling rate, and furnace atmospheric composition.

Shrinkage occurs during sintering. With dry pressing, because the powder is compacted and removed from the die prior to sintering, shrinkage occurs in all directions. Hot pressing is similar to dry pressing, except that the sintering operation is conducted while a compacting force is applied. As a result, shrinkage only occurs in a single direction with hot pressing. Also with hot pressing, since the body need not be freestanding prior to sintering, binding components are not required and are found only in small quantities, if at all. Hot pressing is a beneficial sintering technique for use in connection with the present invention.

Upon sintering, a rough plasma process chamber component is produced. This rough component is then preferably subjected to a final shaping step, for example, a grinding, lapping or polishing step. As a specific example, if the rough component is a rough dielectric window in the shape of a dielectric dome, it is preferably finally shaped by grinding. As another specific example, if the rough ceramic product is a rough process kit ring, it is preferably finally shaped by lapping or polishing. Grinding, lapping, and polishing methods for shaping a rough product are all well known to those of ordinary skill in the art.

Two specific embodiments follow in which an erosion resistant process chamber component is fabricated by hot pressing. The process chamber component consists of a YAG coating over an alumina support. In the first embodiment, a thin layer of YAG powder, including any desired additives, is placed within a die cavity as discussed above. Subsequently, the remainder of the die cavity is filled with an alumina powder, including any desired additives. Once all of the powder is in the die cavity, it is subjected to a hot pressing operation to produce a rough component consisting of a YAG coating adjacent an alumina support material, which is subsequently subjected to a final shaping step.

To reduce thermal stress and to improve adhesion between the alumina support and the YAG coating, in the second embodiment, a thin powder layer is placed within the die. The composition of this powder layer varies gradually from approximately 50 mol % alumina and 50 mol % yttrium oxide (plus any desired additives) at the die surface to approximately 99 mol % alumina and 1 mol % yttrium oxide (plus any desired additives) at the surface of the powder layer remote from the die. The remainder of the die cavity is then filled with alumina (plus any desired additives). Upon hot pressing, this composition gives rise to a rough component which consists of (a) an oxide coating having a YAG surface, with gradually diminishing yttrium content as one proceeds from the surface, and (2) an alumina support material. Any thermal stresses due the CTE mismatch between alumina and YAG are minimized by the graded composition of this component.

In many instances, the shaped body will lend itself to hot pressing to full density in a single step. However, difficulties can arise in sintering structures having multiple compositions, because the composition that sets first will constrain the sintering of the other composition(s) potentially resulting in a weak, porous body. One way to overcome this difficulty is to use multiple hot pressing steps. For instance, in the example above, the graded powder layer (corresponding to the yttrium containing oxide coating) can be hot pressed in a first operation, with the alumina powder region (corresponding to the alumina support material) being hot pressed in a second operation.

Other preferred methods for forming the erosion-resistant components of the present invention involve providing the yttrium containing oxide coating over a preformed support using coating techniques that are known in the art, such as chemical vapor deposition (CVD), physical vapor deposition (PVD), or thermal spraying. Of these, thermal spraying methods are particularly preferred.

In thermal spraying methods, a relatively thin yttrium containing oxide coating is thermally sprayed over a preformed support. For example, powder producing the desired final coating composition (for example, yttrium oxide power, YAG powder, or a mixture of alumina and yttria powders), is heated in a high-temperature gas stream or plasma beam to above the powder melting point. The resultant molten powder material, which is entrained in the gas stream/plasma beam, subsequently strikes the support to be coated. The molten powder material solidifies on contact with the support, forming the desired coating. Plasma spraying and flame spraying are two preferred thermal spraying techniques.

Atmospheric plasma spraying and vacuum plasma spraying are two common plasma-spraying techniques. In atmospheric plasma spraying, the powder is mixed into a stream of inert gas passing at high velocity between two electrodes. The electrically biased electrodes form a plasma (gas discharge) of the gas with a very high effective temperature. The plasma-heated gas and entrained molten powder are directed at the support to be coated. In vacuum plasma spraying, on the other hand, the powder is mixed into a plasma beam, which travels through a vacuum toward the support.

In flame spraying, the powder is mixed with a combustible gas and is ejected at high velocity through a high-temperature flame of the gas toward the support to be coated. The powder arrives at the support in a molten state. In high-velocity oxy-fuel spraying, the powder is mixed into a burning fuel stream.

As a specific example, an yttrium oxide powder or YAG powder, can be plasma sprayed onto a silicon carbide support. If desired, adhesion between the yttrium containing oxide coating and the silicon carbide support material can be improved by provided the silicon carbide in an aluminum-infiltrated form. Aluminum will change the nature of the material from that of a dielectric to that of a conductor, which is acceptable, even desirable, for many components.

More specifically, by infiltrating a porous silicon carbide perform with aluminum or an aluminum alloy, a relatively pore-free composite having the same shape and size as the perform is created. Such composites are frequently called aluminum-silicon carbide (Al—SiC) composites. The silicon carbide preform itself can be made by simple ceramic forming methods such as slip casting, dry pressing, hot pressing, injection molding, or tape casting. Of these, slip casting offers the ability form complex, large shapes, so long as wall thickness does not become excessive. In this process, an aqueous slurry (also known as a "slip"), which contains silicon carbide powders of appropriate particle size, small amounts of a polymeric binder such as Gum Arabica, and dispersing and sintering agents as appropriate, is poured into a Plaster of Paris mold. The mold is shaped to have an internal cavity that corresponds to the external shape of the Al—SiC article to be made. As the mold absorbs the water from the slurry, a uniform deposit of the silicon carbide powder with added binder material forms on the mold's inner surface. Once the thickness of this deposit reaches the desired value, the excess slurry is poured out, the mold is dried, and the green, porous silicon carbide body is separated from it. The small amount of binder that is added to the slurry helps to give the green (i.e., unsintered) body strength enough to be easily handled and even machined where necessary.

The next step is to infiltrate molten aluminum into the silicon carbide body. This step is typically accomplished by either a pressureless infiltration process or a pressure-assisted infiltration process. In the pressureless infiltration process, the porous silicon carbide part is placed in contact with aluminum or aluminum alloy and heated in vacuum until the aluminum pieces melt. (This step also sinters the green body.)

The molten metal then easily wets the silicon carbide, soaking into it to essentially completely fill the connected porosity within it. Alternately, in the pressure-assisted infiltration process the heated porous silicon carbide part is placed in a die-casting apparatus, and molten aluminum is injected into the die at high pressure.

The CTE of the Al—SiC composite can be varied in the range of about $5.5 \times 10^{-6}$/K to $7 \times 10^{-6}$/K by varying the ratio of silicon carbide to aluminum in the composite. At the low end of CTE range, additional amounts of silicon carbide are formed during the infiltration process by the reaction between excess carbon deliberately introduced into the porous body and silicon deliberately alloyed with the aluminum.

Like aluminum, the resulting material is strong, tough, and has a high thermal conductivity. However, as seen in the table below, its thermal expansion coefficient is far lower than that of aluminum and is similar to that of common ceramic materials such as alumina, aluminum nitride, YAG or yttrium oxide (although not listed in the table below, the properties of yttrium oxide are similar to those of YAG).

| Material | Density (g/cc) | CTE ($\times 10^{-6}$/K) | Thermal Conductivity (W/m/K) | Ultimate Tensile Strength (psi) | Elastic Modulus (Gpa) |
| --- | --- | --- | --- | --- | --- |
| Al-SiC (70% SiC) | 3.02 | 7.0-7.3 | 200 | 192 | 224 |
| Aluminum | 2.7 | 23 | 220 | 90 | 70 |
| Alumina ($Al_2O_3$) | 3.6 | 6.7 | 34 | — | 380 |
| Yttrium Alumina Garnet | 4.55 | 7.8 | 10 | — | 282 |
| AlN | 3.3 | 4.5 | 170 | — | 345 |

Adhesion between the yttrium containing oxide coating and the support can also be addressed by slowly varying the composition of the coating during thermal spraying. For example, in the case of an alumina support having a YAG coating, the composition of the coating can be gradually changed during thermal spraying from a nearly pure alumina composition adjacent the support, to a YAG composition at the coating surface.

Although various embodiments are specifically illustrated and described herein, it will be appreciated that modifications and variations of the present invention are covered by the above teachings and are within the purview of the appended claims without departing from the spirit and intended scope of the invention.

All of the features disclosed in this specification (including any accompanying claims, abstract and drawings), and/or all of the steps of any method or process so disclosed, may be combined in any combination, except for combinations where at least some of the features and/or steps are mutually exclusive.

Each feature disclosed in this specification (including any accompanying claims, abstract, and drawings), may be replaced by alternative features serving the equivalent or similar purpose, unless expressly stated otherwise. Thus, unless sly stated otherwise, each feature disclosed is one example only of a generic of equivalent or similar features.

The invention claimed is:

1. An erosion-resistant article comprising:
   a zirconium alloy support; and
   an oxide coating comprising yttrium disposed over said support, wherein said support and said oxide coating have material compositions that differ from one another in coefficient of thermal expansion by no more than $5 \times 10^{-6}$/K, and wherein said erosion-resistant article is a plasma process chamber component.

2. The erosion-resistant article of claim 1, wherein said material compositions differ from one another in coefficient of thermal expansion by no more than $3 \times 10^{-6}$/K.

3. The erosion-resistant article of claim 1, wherein said material compositions differ from one another in coefficient of thermal expansion by no more than $1 \times 10^{-6}$/K.

4. An erosion-resistant article comprising:
   an aluminum-silicon carbide support; and
   an oxide coating comprising yttrium disposed over said support, wherein said support and said oxide coating have material compositions that differ from one another in coefficient of thermal expansion by no more than $5 \times 10^{-6}$/K, wherein said erosion-resistant article is a plasma process chamber component.

5. The erosion-resistant article of claim 4, wherein said oxide coating is an yttria coating.

6. The erosion-resistant article of claim 4, wherein said oxide coating further comprises aluminum.

7. The erosion-resistant article of claim 4, wherein said oxide coating is an yttrium aluminum garnet coating.

8. The erosion-resistant article of claim 4, further comprising an intermediate region between said oxide coating and said support, wherein said intermediate region, said support and said oxide coating have material compositions that differ from one another in coefficient of thermal expansion by no more than $5 \times 10^{-6}$/K.

9. The erosion-resistant article of claim 4, wherein said component is a chamber wall component.

10. The erosion-resistant article of claim 4, wherein said component is a ring-shaped component.

11. The erosion-resistant article of claim 10, wherein said ring-shaped component is a process kit component.

12. The erosion-resistant article of claim 11, wherein said ring-shaped component is a focus ring.

13. The erosion-resistant article of claim 11, wherein said ring-shaped component is a capture ring.

14. The erosion-resistant article of claim 11, wherein said ring-shaped component is an insert ring.

15. The erosion-resistant article of claim 4, wherein said component is a dielectric window.

16. The erosion resistant article of claim 4, wherein said oxide coating is a physical vapor deposited coating or a chemical vapor deposited coating.

17. The erosion resistant article of claim 4, wherein said oxide coating is a thermal sprayed coating.

18. The erosion resistant article of claim 4, wherein said oxide coating is a plasma sprayed coating.

19. The erosion resistant article of claim 4, wherein said oxide coating is a sintered-powder oxide coating.

20. An erosion-resistant article comprising:
   a support formed from aluminum-silicon carbide; and
   an oxide coating selected from yttria and yttrium aluminum garnet, wherein said support and said oxide coating have material compositions that differ from one another in coefficient of thermal expansion by no more than $5 \times 10^{-6}$/K, and wherein said erosion-resistant article is a plasma process chamber component.

21. The erosion-resistant article of claim 20, wherein said plasma process chamber component is selected from a focus ring, an insert ring, a capture ring, a chamber wall component and a dielectric window.

22. An erosion-resistant article comprising:
   a support selected from an aluminum-silicon carbide support and a zirconium alloy support; and a sintered-powder oxide coating comprising yttrium disposed over said support, wherein said support and said oxide coating comprising yttrium have material compositions that differ from one another in coefficient of thermal expansion by no more than $5\times10^{-6}$/K.

23. The erosion-resistant article of claim 22, wherein said material compositions differ from one another in coefficient of thermal expansion by no more than $3\times10^{-6}$/K.

24. The erosion-resistant article of claim 22, wherein said material compositions differ from one another in coefficient of thermal expansion by no more than $1\times10^{-6}$/K.

25. The erosion-resistant article of claim 22, wherein said support is an aluminum-silicon carbide support.

26. The erosion-resistant article of claim 22, wherein said oxide coating is an yttria coating.

27. The erosion-resistant article of claim 22, wherein said oxide coating further comprises aluminum.

28. The erosion-resistant article of claim 22, wherein said oxide coating is an yttrium aluminum garnet coating.

29. The erosion-resistant article of claim 22, wherein said component is a chamber wall component.

30. The erosion-resistant article of claim 22, wherein said component is a ring-shaped component.

31. The erosion-resistant article of claim 22, wherein said component is a dielectric window.

32. The erosion-resistant article of claim 22, wherein said support is a sintered-powder support.

* * * * *